US012765078B2

(12) United States Patent
Schneller et al.

(10) Patent No.: US 12,765,078 B2
(45) Date of Patent: Oct. 13, 2026

(54) PHOTOVOLTAIC CELLS

(71) Applicant: SILFAB INC., Mississauga (CA)

(72) Inventors: Eric Schneller, Bellingham, WA (US); Paolo Dilorenzo, Leuven (BE); Mahyar Mohammadnezhad, North York (CA); Michael Duane Alexander, Custer, WA (US); Itai Suez, Georgetown (CA); Joshua Williams, Bellingham, WA (US)

(73) Assignee: SILFAB INC., Mississauga (CA)

( * ) Notice: Subject to any disclaimer, the term of this patent is extended or adjusted under 35 U.S.C. 154(b) by 0 days.

(21) Appl. No.: 18/712,217

(22) PCT Filed: Nov. 21, 2022

(86) PCT No.: PCT/IB2022/061235
§ 371 (c)(1),
(2) Date: May 21, 2024

(87) PCT Pub. No.: WO2023/089584
PCT Pub. Date: May 25, 2023

(65) Prior Publication Data

US 2025/0015215 A1 Jan. 9, 2025

Related U.S. Application Data

(60) Provisional application No. 63/264,381, filed on Nov. 22, 2021.

(51) Int. Cl.
*H10F 19/85* (2025.01)
*H10F 19/90* (2025.01)
*H10F 71/00* (2025.01)

(52) U.S. Cl.
CPC ........... *H10F 19/85* (2025.01); *H10F 19/908* (2025.01); *H10F 71/00* (2025.01)

(58) Field of Classification Search
CPC ........ H10F 19/85; H10F 19/908; H10F 71/00; H10F 10/146
See application file for complete search history.

(56) References Cited

U.S. PATENT DOCUMENTS 7,643,522 B2 1/2010 Trintchouk et al.
7,745,313 B2 6/2010 Wang et al.
(Continued)

FOREIGN PATENT DOCUMENTS

CN 110605794 A * 12/2019 ............ B28D 5/045
CN 111952411 11/2020
(Continued)

OTHER PUBLICATIONS

Machine translation of CN110605794A, Yang, Fei. (Year: 2019).*
(Continued)

*Primary Examiner* — Mayla Gonzalez Ramos
(74) *Attorney, Agent, or Firm* — DLA Piper LLP (US)

(57) ABSTRACT

An example of an apparatus to generate electricity from light with photovoltaic cells is provided. The apparatus includes a plurality of photovoltaic cells. The plurality of photovoltaic cells is to form a module. Furthermore, the apparatus includes an electro-conductive backsheet to connect the plurality of photovoltaic cells. The electro-conductive backsheet is to collect current from the plurality of photovoltaic cells. Each photovoltaic cell of the plurality of photovoltaic cells is formed on a silicon wafer by cutting along a {100} plane to provide a substantially square wafer and cleaving the substantially square wafer along a preferred cleavage plane.

3 Claims, 12 Drawing Sheets

(56) References Cited

U.S. PATENT DOCUMENTS

| | | | |
|---|---|---|---|
| 7,999,174 B2 | 8/2011 | Moslehi | |
| 8,035,027 B2 | 10/2011 | Moslehi | |
| 8,035,028 B2 | 10/2011 | Moslehi | |
| 8,053,665 B2 | 11/2011 | Moslehi et al. | |
| 8,084,684 B2 | 12/2011 | Moslehi | |
| 8,129,822 B2 | 3/2012 | Moslehi | |
| 8,168,465 B2 | 5/2012 | Wang et al. | |
| 8,193,076 B2 | 6/2012 | Moslehi et al. | |
| 8,288,195 B2 | 10/2012 | Wang et al. | |
| 8,293,558 B2 | 10/2012 | Wang et al. | |
| 8,294,026 B2 | 10/2012 | Wang et al. | |
| 8,324,499 B2 | 12/2012 | Moslehi | |
| 8,399,331 B2 | 3/2013 | Moslehi et al. | |
| 8,420,435 B2 | 4/2013 | Rana et al. | |
| 8,512,581 B2 | 8/2013 | Wang et al. | |
| 8,637,340 B2 | 1/2014 | Moslehi et al. | |
| 8,664,737 B2 | 3/2014 | Wang et al. | |
| 8,742,249 B2 | 6/2014 | Moslehi | |
| 8,847,060 B2 | 9/2014 | Moslehi | |
| 8,853,521 B2 | 10/2014 | Moslehi et al. | |
| 8,892,112 B2 | 11/2014 | Meredith et al. | |
| 8,937,243 B2 | 1/2015 | Kapur et al. | |
| 8,946,547 B2 | 2/2015 | Moslehi et al. | |
| 8,962,380 B2 | 2/2015 | Moslehi et al. | |
| 9,093,323 B2 | 7/2015 | Wang et al. | |
| 9,130,076 B2 | 9/2015 | Moslehi et al. | |
| 9,196,759 B2 | 11/2015 | Moslehi et al. | |
| 9,214,585 B2 | 12/2015 | Rana et al. | |
| 9,236,510 B2 | 1/2016 | Moslehi et al. | |
| 9,293,619 B2 | 3/2016 | Moslehi et al. | |
| 9,318,644 B2 | 4/2016 | Moslehi et al. | |
| 9,349,887 B2 | 5/2016 | Moslehi | |
| 9,379,258 B2 | 6/2016 | Kapur et al. | |
| 9,397,250 B2 | 7/2016 | Moslehi et al. | |
| 9,419,165 B2 | 8/2016 | Rana et al. | |
| 9,455,362 B2 | 9/2016 | Moslehi et al. | |
| 9,508,886 B2 | 11/2016 | Rana et al. | |
| 9,515,217 B2 | 12/2016 | Moslehi et al. | |
| 9,590,035 B2 | 3/2017 | Wang et al. | |
| 9,595,622 B2 | 3/2017 | Kapur et al. | |
| 9,768,343 B2 | 9/2017 | Rana et al. | |
| 9,842,949 B2 | 12/2017 | Moslehi et al. | |
| 9,929,288 B2 | 3/2018 | Moslehi et al. | |
| 10,181,535 B2 | 1/2019 | Moslehi et al. | |
| 10,181,541 B2 | 1/2019 | Moslehi | |
| 10,784,815 B2 | 9/2020 | Moslehi | |
| 2006/0114956 A1 | 6/2006 | Sandstrom et al. | |
| 2006/0114958 A1 | 6/2006 | Trintchouk et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |
| 2010/0148318 A1 | 6/2010 | Wang et al. | |
| 2010/0148319 A1 | 6/2010 | Wang et al. | |
| 2010/0154998 A1 | 6/2010 | Ong | |
| 2010/0175752 A1 | 7/2010 | Wang et al. | |
| 2010/0267186 A1 | 10/2010 | Wang et al. | |
| 2010/0279494 A1 | 11/2010 | Wang et al. | |
| 2010/0304521 A1 | 12/2010 | Seutter et al. | |
| 2010/0304522 A1 | 12/2010 | Rana et al. | |
| 2011/0021006 A1 | 1/2011 | Moslehi et al. | |
| 2011/0108098 A1 | 5/2011 | Kapur | |
| 2011/0122901 A1 | 5/2011 | Sandstrom et al. | |
| 2011/0124145 A1 | 5/2011 | Moslehi | |
| 2011/0265867 A1 | 11/2011 | Moslehi | |
| 2011/0272013 A1 | 11/2011 | Moslehi | |
| 2012/0012160 A1 | 1/2012 | Moslehi | |
| 2012/0017971 A1 | 1/2012 | Moslehi | |
| 2012/0017988 A1 | 1/2012 | Moslehi | |
| 2012/0021560 A1 | 1/2012 | Moslehi et al. | |
| 2012/0028399 A1 | 2/2012 | Moslehi et al. | |
| 2012/0080074 A1* | 4/2012 | Hardikar | H10F 19/807 136/251 |
| 2012/0103408 A1 | 5/2012 | Moslehi et al. | |
| 2012/0111407 A1* | 5/2012 | Rummens | B32B 7/12 428/327 |
| 2012/0122272 A1 | 5/2012 | Rana et al. | |
| 2012/0125256 A1 | 5/2012 | Kramer et al. | |
| 2012/0167819 A1 | 7/2012 | Kramer et al. | |
| 2012/0171804 A1 | 7/2012 | Moslehi et al. | |
| 2012/0174860 A1 | 7/2012 | Moslehi | |
| 2012/0174861 A1 | 7/2012 | Wang et al. | |
| 2012/0178203 A1 | 7/2012 | Moslehi et al. | |
| 2012/0180867 A1 | 7/2012 | Moslehi | |
| 2012/0225515 A1 | 9/2012 | Moslehi et al. | |
| 2012/0272490 A1 | 11/2012 | Moslehi et al. | |
| 2012/0305063 A1 | 12/2012 | Moslehi et al. | |
| 2013/0000715 A1 | 1/2013 | Moslehi et al. | |
| 2013/0023281 A1 | 1/2013 | Meredith et al. | |
| 2013/0130430 A1 | 5/2013 | Moslehi et al. | |
| 2013/0137244 A1 | 5/2013 | Kramer et al. | |
| 2013/0164883 A1 | 6/2013 | Moslehi et al. | |
| 2013/0167904 A1 | 7/2013 | Moslehi | |
| 2013/0167915 A1 | 7/2013 | Moslehi et al. | |
| 2013/0171767 A1 | 7/2013 | Moslehi et al. | |
| 2013/0213469 A1 | 8/2013 | Kramer et al. | |
| 2013/0217172 A1 | 8/2013 | Rana et al. | |
| 2013/0228221 A1 | 9/2013 | Moslehi et al. | |
| 2013/0233378 A1 | 9/2013 | Moslehi et al. | |
| 2013/0280887 A1 | 10/2013 | Ricocol et al. | |
| 2013/0284255 A1 | 10/2013 | Wang et al. | |
| 2013/0288418 A1 | 10/2013 | Wang et al. | |
| 2013/0288425 A1 | 10/2013 | Rana et al. | |
| 2013/0330872 A1 | 12/2013 | Rana et al. | |
| 2014/0060610 A1 | 3/2014 | Moslehi et al. | |
| 2014/0127834 A1 | 5/2014 | Wang et al. | |
| 2014/0158193 A1 | 6/2014 | Desphande et al. | |
| 2014/0318611 A1 | 10/2014 | Moslehi et al. | |
| 2014/0326295 A1 | 11/2014 | Moslehi | |
| 2014/0360567 A1 | 12/2014 | Seutter et al. | |
| 2014/0370650 A1 | 12/2014 | Moslehi et al. | |
| 2015/0020877 A1 | 1/2015 | Moslehi et al. | |
| 2015/0056742 A1 | 2/2015 | Rana et al. | |
| 2015/0061086 A1 | 3/2015 | Wang et al. | |
| 2015/0068583 A1 | 3/2015 | Moslehi | |
| 2015/0125990 A1 | 5/2015 | Moslehi et al. | |
| 2015/0136227 A1 | 5/2015 | Moslehi et al. | |
| 2015/0140721 A1 | 5/2015 | Moslehi et al. | |
| 2015/0144190 A1 | 5/2015 | Moslehi et al. | |
| 2015/0171230 A1 | 6/2015 | Kapur et al. | |
| 2015/0171240 A1 | 6/2015 | Kapur et al. | |
| 2015/0179846 A1 | 6/2015 | Moslehi | |
| 2015/0187969 A1 | 7/2015 | Moslehi | |
| 2015/0194547 A1 | 7/2015 | Moslehi | |
| 2015/0200313 A1 | 7/2015 | Moslehi et al. | |
| 2015/0236182 A1 | 8/2015 | Moslehi | |
| 2015/0236638 A1 | 8/2015 | Moslehi | |
| 2015/0243814 A1 | 8/2015 | Moslehi et al. | |
| 2015/0325714 A1 | 11/2015 | Kapur et al. | |
| 2015/0349708 A1 | 12/2015 | Moslehi | |
| 2016/0013335 A1 | 1/2016 | Moslehi et al. | |
| 2016/0035918 A9 | 2/2016 | Moslehi | |
| 2016/0087579 A1 | 3/2016 | Moslehi | |
| 2016/0093763 A1 | 3/2016 | Rana et al. | |
| 2016/0172512 A1 | 6/2016 | Stalcup et al. | |
| 2016/0190366 A1 | 6/2016 | Moslehi et al. | |
| 2016/0336465 A1 | 11/2016 | Moslehi et al. | |
| 2016/0336473 A1 | 11/2016 | Rana et al. | |
| 2017/0005206 A1 | 1/2017 | Moslehi et al. | |
| 2017/0104122 A1 | 4/2017 | Moslehi et al. | |
| 2017/0133546 A1 | 5/2017 | Rana et al. | |
| 2017/0229591 A1 | 8/2017 | Moslehi | |
| 2017/0236954 A1 | 8/2017 | Kramer et al. | |
| 2017/0236961 A1 | 8/2017 | Rana et al. | |
| 2017/0236969 A1 | 8/2017 | Moslehi et al. | |
| 2017/0244358 A1 | 8/2017 | Moslehi | |
| 2017/0278991 A1 | 9/2017 | Moslehi et al. | |
| 2017/0323989 A1 | 11/2017 | Moslehi | |

(56) References Cited

U.S. PATENT DOCUMENTS

| | | | | |
|---|---|---|---|---|
| 2018/0166598 A1* | 6/2018 | Okandan | ................. | H10F 19/00 |
| 2020/0020819 A1* | 1/2020 | Farhangi | ................. | H10F 19/31 |
| 2021/0058028 A1 | 2/2021 | Moslehi | | |
| 2022/0199844 A1* | 6/2022 | Huang | .................... | H10F 19/31 |

FOREIGN PATENT DOCUMENTS

| | | | | |
|---|---|---|---|---|
| DE | 102010020974 | 11/2011 | | |
| WO | WO-2014127067 A1 * | 8/2014 | ......... | H01L 27/1421 |

OTHER PUBLICATIONS

International Search Report and Written Opinion for International Application No. PCT/IB2022/061235, mailed Mar. 2, 2023, 19 Pages.

* cited by examiner

PHOTOVOLTAIC CELLS

CROSS-REFERENCE TO RELATED APPLICATION

This application is the National Stage filing under 35 U.S.C. 371 of International Application No. PCT/IB2022/061235, filed Nov. 21, 2022, which claims priority to U.S. Provisional Patent Application No. 63/264,381, filed Nov. 22, 2021, which are both incorporated by reference in their entireties.

BACKGROUND

Photovoltaic cells are electrical devices that convert light energy into electrical energy. Photovoltaic cells are typically made from semiconductor materials connected to an electrical circuit through various metallic contacts. The most common material used for this purpose is crystalline silicon. In this case a crystalline silicon wafer goes through various physical and chemical process steps to become a functional photovoltaic cell.

The electrical performance of a photovoltaic cell is primarily governed by the material properties and overall design of the semiconductor device. Electrical performance is evaluated by measuring the current response as a function of voltage when light is applied to the device. The voltage at zero current is commonly referred to as the open-circuit voltage of the device. This metric is governed by the properties of the device and is largely independent of device area. Alternatively, the current is directly proportional to the device area and is typically reported in terms of current per unit area when comparing between different technologies.

The photovoltaic cell is the foundational building block, however the more typical finished good is a photovoltaic module. A photovoltaic module is assembled from many photovoltaic cells connected together electrically and a packaged using set of encapsulating and mechanically supporting materials, such as glass, plastic, and aluminum.

For example, each photovoltaic cell may include a front and rear metal contact used for interconnection, such as by soldering copper wire/ribbon to contacts of adjacent photovoltaic cells. In other examples, adjacent photovoltaic cells may be shingled where the back of one photovoltaic cell overlaps with the front of an adjacent photovoltaic cell using a conductive adhesive forming the contact between the two photovoltaic cells.

The resulting electrical properties of the photovoltaic modules is a result of the way the photovoltaic cells are interconnected together. These interconnections can be in series, parallel, or some combination. Interconnecting cells in series increases the voltage, while interconnecting cells in parallel increases the current.

SUMMARY

In accordance with an aspect of the invention, a method is provided. The method involves obtaining a silicon wafer. The silicon wafer is formed by cutting along a {100} plane. In addition, the silicon wafer is substantially square. The method further involves cleaving the silicon wafer along a {110} plane to form non-rectangular shapes from a starting square, such as triangular pieces. In addition, the method involves arranging a plurality of triangular pieces to form a module.

The cleaving may involve scoring a scribe line. In an example, the scoring may involve mechanically scoring the scribe line. In another example, the scoring may involve scoring the scribe line with a laser.

The method may further involve connecting the plurality of pieces with an electro-conductive backsheet. The electro-conductive backsheet may be flexible. The plurality of triangular pieces may be back-contact cells.

The method may further involve mounting the module on a rail. The rail may be installed on the rooftop.

In accordance with an aspect of the invention, triangular photovoltaic cells manufactured by the methods described herein are provided. Furthermore, in accordance with an aspect of the invention, modules having a plurality of triangular photovoltaic cells are provided.

BRIEF DESCRIPTION OF THE DRAWINGS

Reference will now be made, by way of example only, to the accompanying drawings in which.

DETAILED DESCRIPTION

Figure 1A:
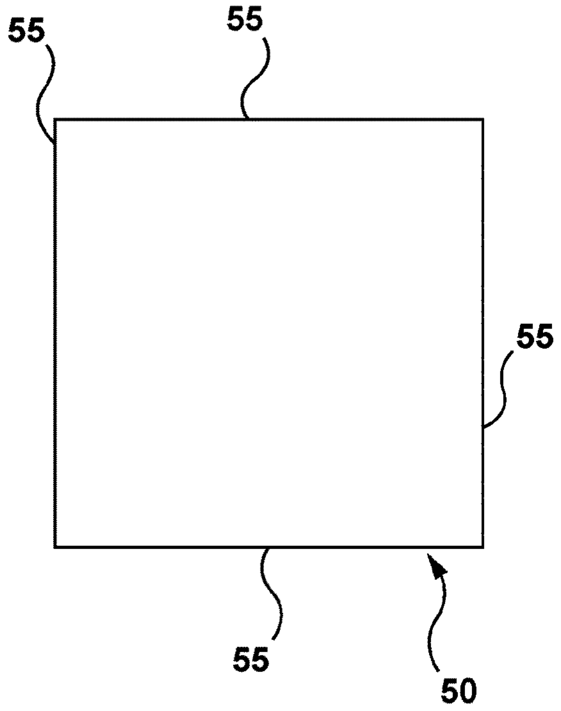
FIG. 1A is a top view of an example of a silicon wafer.

In describing the components of the device and alternative examples of some of these components, the same reference number may be used for elements that are the same as, or similar to, elements described in other examples. As used herein, any usage of terms that suggest an absolute orientation (e.g. “top”, “bottom”, “front”, “back”, etc.) are for illustrative convenience. Such terms are not to be construed in a limiting sense as it is contemplated that various components will, in practice, be utilized in orientations that are the same as, or different than those described or shown.

Photovoltaic cells are generally connected with other photovoltaic cells to form a module. In general, photovoltaic cells are subdivided into smaller pieces or sub-cells from which the module may be assembled. For example, photovoltaic cells are generally subdivided into rectangular pieces with a laser to be assembled into a module. Once connected, the photovoltaic cells form a circuit from which current may be generated from exposure to light. To generate useful power from a photovoltaic module, external power electronics may be used to maintain the operating voltage in the optimal range for power generation. Although these external power electronics may be designed for a wide range of currents and voltages, the specific configurations of the module have led to widely available commercially produced units that require a relatively narrow range of currents and voltages.

Since the photovoltaic module is configured to collect light, it is often placed in a space that is not otherwise used and that is generally unobstructed from the sky, such as a rooftop, to capture as much light as possible. As such, the dominant shape of these panels has evolved to be rectangular. This is similar to a window or sheet of planar construction material. These form factors have become semi-standard and the associated industries, such as installation services and mounting equipment suppliers, have evolved around this form factor.

Crystalline silicon based photovoltaic cells are available in increasing sizes as original silicon ingots can be manufactured to larger sizes based on technological improvements. Accordingly, this has led to crystalline silicon wafers with larger areas used to manufacture photovoltaic cells. In general, the crystalline silicon wafers used for photovoltaic cells are substantially square wafers cut from a silicon ingot along the {100} planes. The increase in area increases the electrical current produced from each photovoltaic cell since the electrical current scales linearly with area. This results in increased parasitic resistance within the interconnection wires which impacts the power output of the photovoltaic module. To mitigate this issue, the photovoltaic cells may be cut prior to assembly within a photovoltaic module. For example, these cells may be cut into rectangular (or pseudo rectangular) sub-cells. In some examples, each cell may be cut in half to form two rectangular sub-cells. In other examples, the cells may be cut into smaller rectangular sub-cells, such as thirds, to provide three rectangular sub-cells.

Rectangular wafers are generally formed by cutting along the {100} family of crystal planes from a large silicon ingot. The cutting is performed using a wire saw method, which is preferred along this plane because it provides the best mechanical stability during the cutting process. Once the ingot is sawed into wafers, the substantially square edges are parallel to these {100} planes. Wafers are cut into squares (or pseudo squares) to increase the packing density of cells within a module to reduce gaps and/or overlap between wafers. Accordingly, subsequent cuts of the square crystalline silicon wafers along a {100} plane will provide rectangular shaped pieces. It is to be appreciated to a person of skill with the benefit of this description that maintaining the quality of a cut is difficult as the size of the wafer increases as the risk of edge defects and micro crack formations increases with size. Therefore, for larger wafer sizes, such as substantially square wafers that are larger than about 165 mm along an edge, the rectangular wafers may include defects that may affect the performance and the production yield of the photovoltaic cells.

By contrast, silicon wafers used in the integrated circuit industry which are generally not to be packed into a module where higher coverage of the wafers in a module are desired and instead a larger surface area on each wafer is desired to fit more devices on each wafer. Therefore, crystalline silicon wafers for use in the integrated circuit industry are generally circular shape to reduce wastage of crystalline silicon wafer. In the semiconductor industry, instead of using a wire saw to cut a crystalline silicon wafer, cuts may be made by cleaving the silicon wafer along the more the preferred cleavage planes of {110} or {111}. This is carried out using a scribe and cleave approach, where a scribe line is generated by either a laser or mechanical tool, and then mechanical pressure is applied to the wafer that results in complete fracture along the scribe line. This approach may also be used for substantially square silicon wafers used in the solar industry by scribing along the {100} plane. Since this is not a cleavage plane of silicon, there is a higher probability of edge defects, particularly as the size of the crystalline silicon wafer increases.

In the present examples, the photovoltaic cells may be back-contact type cells such as interdigitated back-contact (IBC), metal wrap-through (MWT)/emitter wrap through (EWT). Accordingly, since the photovoltaic cells have contacts exclusively on the back instead of the front and back, a non-conventional cell shape, such as a triangle can be used when combined with a flexible electro-conductive backsheet (ECBS) where the circuit connections are monolithically integrated. By contrast, conventional photovoltaic cells with contacts on the front and the back are generally interconnected in a linear fashion to produce a rectangular module to be mounted on one or more rails.

Figure 1B:
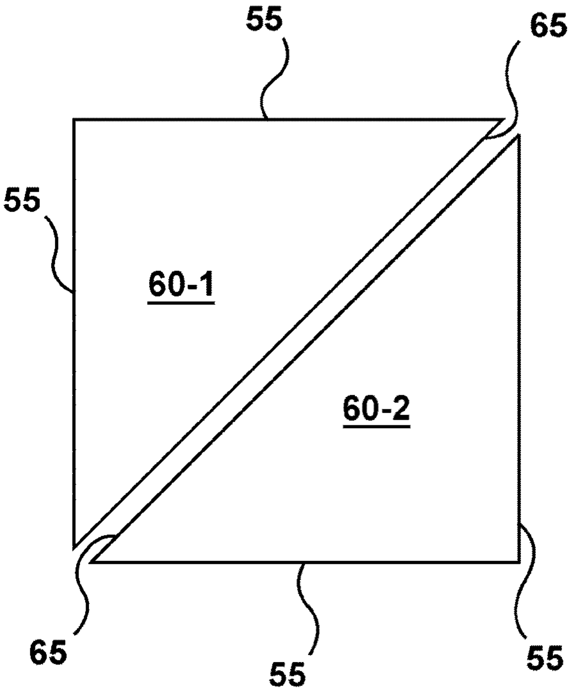
FIG. 1B is a top view of the silicon wafer of FIG. 1A cleaved along a preferred cleavage plane.

Referring to FIGS. 1A and 1B, a substantially square crystalline silicon wafer 50 manufactured into a photovoltaic cell is generally shown as a whole (FIG. 1A) and cleaved in half along a {110} plane (FIG. 1B). In the present example, the wafer 50 is formed by cutting along the {100} planes 55 from a silicon ingot. In particular, the monocrystalline silicon wafers 50 are manufactured using the Czochraliski (CZ) process to produce a single crystal ingot and then wafering along the {100} crystal lattice plane. The whole photovoltaic cell 50 can be cut into non-conventional shapes over about 166 mm and used in existing back-contact photovoltaic module designs, such as with a back-contact electro-conductive backsheet structure, and manufacturing processes. It is to be appreciated by a person of skill with the benefit of this description that a cleavage plane of the wafer 50 is along the {110} plane 65 or diagonal cross-sectional plane. Accordingly, cleaving along the {110} plane 65 will provide non-conventional substantially triangular pieces or sub-cells 60-1 and 60-2 (generically, these sub-cells are referred to herein as "sub-cell 60" and collective they are referred to as "sub-cells 60"). A cleave along the {110} plane 65 results in less edge defects and provides the potential for a high quality method to separate a wafer 50 into multiple sub-cells 60. Cutting the photovoltaic cell on the silicon wafer 50 in half using this approach provides two substantially triangular sub-cells 60. It is to be appreciated that any perpendicular plane to the {110} plane 65 may be used for additional cuts to provide smaller triangular sub-cells or pieces in other shapes depending on where the cleaves are made.

Scribing and cleaving along a cleavage plane, such as the {110} plane 65, provides a repeatable process with reduced edge defects. However, due to the general inability to arrange irregularly shaped sub-cells with front and rear contact interconnection methods on a module, cleaving along the {110} plane 65 is not generally carried out in the solar industry. Scribing and cleaving along the {110} plane 65 cuts the wafer 50 along the diagonal of the wafer 50 to form substantially triangular sub-cells 60. By cutting along the cleavage plane to reduce the potential for edge damage provides increased production yields using existing and reliable manufacturing methods. It is to be appreciated by a person of skill in the art with the benefit of this description that rear contact (i.e. back-contact) photovoltaic cells using a rear interconnect foil can accommodate irregularly shaped sub-cells in a module.

Accordingly, each substantially triangular sub-cell 60 cut from the silicon wafer 50 includes two edges along the {100} plane that are substantially perpendicular to each other. The third edge of the substantially triangular sub-cell 60 is to be cleaved along a preferred cleavage plane. The preferred cleavage plane of the silicon wafer 50 is not particularly limited and the silicon wafer 50 may include multiple preferred cleavage planes. In the present example, the preferred cleavage plane is the {110} plane 65. In other examples, the preferred cleavage plane may be the {111} plane (not shown). Since the {111} plane projected onto the wafer 50 is not at 45° form the {100} plane, the sub-cells formed from cleaving along this plane may not be substantially triangular. However, the sub-cells formed from cleaving along the {111} plane or any other preferred cleavage plane may still be used to form a module by tessellating the sub-cells 60 together.

Figure 1C:
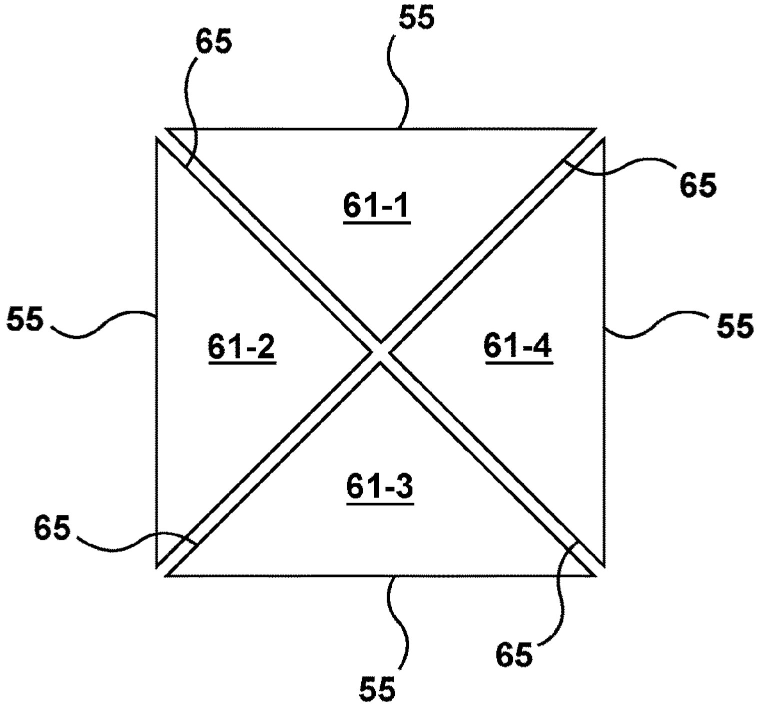
FIG. 1C is a top view of the silicon wafer of FIG. 1A cleaved along two preferred cleavage planes.

It is to be appreciated that in further examples, the substantially triangular sub-cell 60 may be further cleaved into smaller sub-cells along addition preferred cleavage planes. Referring to FIG. 1C, the wafer 50 is cleaved twice along perpendicular {110} planes to create quarter sized sub-cells 61-1, 61-2, 61-3, and 61-4 (generically, these sub-cells are referred to herein as "sub-cell 61" and collective they are referred to as "sub-cells 61"). The tessellation of sub-cells 61 in this iteration can be achieved by arranging two sub-cells 61 to form a substantially square unit. In the present example, the wafer 50 may be an industry standard about 210 mm by about 210 mm wafer size used for solar applications. Accordingly, the resulting square dimension from the two sub-cells 61 would be approximately about 148 mm by about 148 mm. This dimension allows for additional form factors not feasible with standard rectangular sub-cells.

A rectangular photovoltaic module can be formed from the tessellation of a plurality of the triangular sub-cells 60. The interconnection of these sub-cells is enabled by the rear interconnect foil. Since the plurality of the triangular sub-cells 60 have a diagonal edge along the {110} plane 65 that is longer than the square edge along the {100} planes 55, additional dimensional permutations can be achieved through tessellation that would not be possible using rectangular sub-cells.

Figure 2:
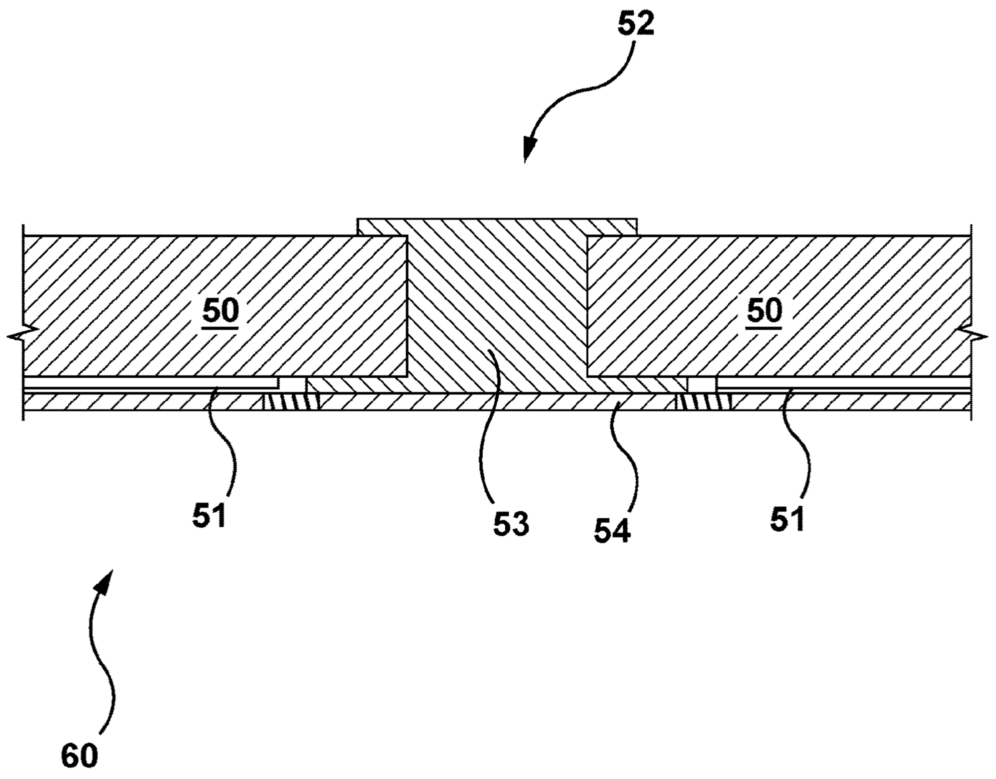
FIG. 2 is a cross-sectional view of a via to connect a frontside of a module to a backside of the module.

In some examples, of the photovoltaic sub-cells 60 may each include a via 52 shown in FIG. 2. The via 52 is a hole through the silicon wafer 50 to allow the front-side of the silicon wafer 50 to connect to the backside of the silicon wafer 50. Accordingly, the via 52 provides for the negative electrode disposed on the frontside the of the silicon wafer 50 to connect with the electrical circuit using contacts 51 disposed on the backside. The negative electrode disposed on the frontside of the semiconductor material is not particularly limited and may include various patterns. The negative electrode is to contact the frontside surface of the silicon wafer 50 to collect current for the electrical circuit. The negative electrode includes a conductive material 53 to carry current collected on the negative frontside of the silicon wafer 50 to the backside through the via 52. Accordingly, the present example provides a plurality of back contacts 51 to serve as the positive electrode of the photovoltaic sub-cell 60 and a plurality of back contacts from the conductive material 53 to serve as a negative electrode of the photovoltaic sub-cell 60. The back contacts of each photovoltaic sub-cell 60 may be used to connect to additional photovoltaic sub-cells 60 via an electrical connector to form the module. The electrical connector is not limited and may be any connector capable of connecting various contacts between photovoltaic sub-cells 60 in the module. For example the electrical connector may be wiring or a printed circuit board. In the present example, the connector may be an electro-conductive backsheet 54. The electro-conductive backsheet 54 is not particularly limited. In the present example, the electro-conductive backsheet 54 may be made from a flexible material to be malleable during the assembly process of the module. The material of the electro-conductive backsheet 54 is also not particularly limited and may include a conductive foil material within insulating material disposed between conductive portions to separate the positive and negative contacts on the back of each sub-cell 60.

Furthermore, the connector may be used to connect non-adjacent photovoltaic sub-cells 60 in some examples. It is to be appreciated by a person of skill with the benefit of this description that the number of photovoltaic sub-cells 60 connected via back contacts is not limited and may be varied to form a module that provides a target power to form a module with a desired electrical output based on current, voltage, or power.

Figure 3A:
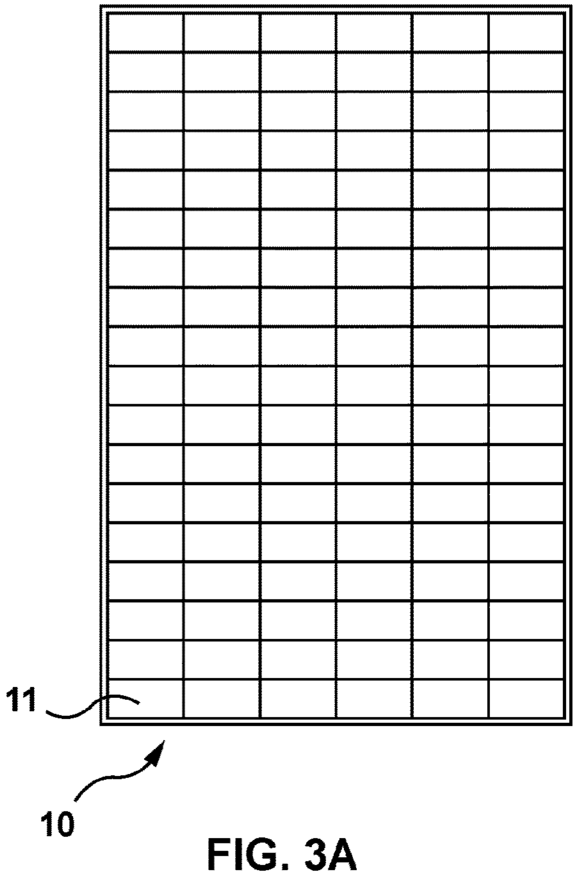
FIG. 3A is a top view of a plurality of rectangular sub-cells arranged to form an example of a module.
Figure 5A:
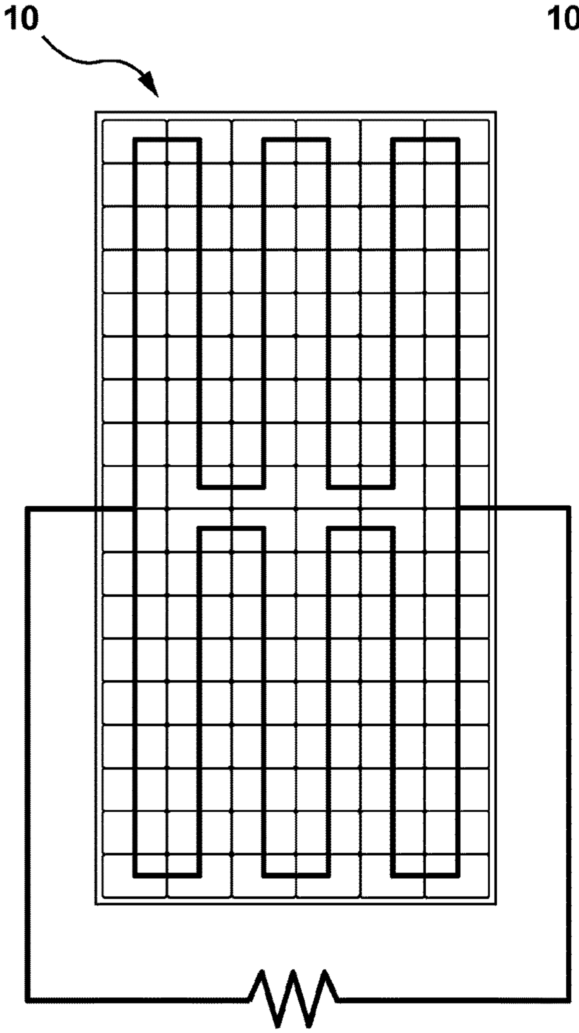
FIG. 5A is a top view of an example of the wiring of the sub-cells of the module shown in FIG. 3A.

Referring to FIG. 3A, an illustration of a module 10 formed from wafers 50 that have been cut in half to form two substantially rectangular sub-cells 11 is generally shown. Referring to FIG. 5A, the current flow through the module 10 is illustrated where each of the rectangular sub-cells 11 are connected in series. In the present example, the module 10 is divided into two circuits to generate electricity in parallel. The rectangular sub-cells provide integer units by which the length and width of the module 10 can be configured. In addition, the module 10 includes an even number of cell columns to interconnect the module 10 in a way that allows the starting point and ending point of the series connected photovoltaic cells to be on the same side of the module. In other examples, it is to be appreciated that the manner by which the sub-cells are connected may be varied. For example, the module 10 may be divided into more circuits to generate electricity in parallel. In other examples, the module 10 may have all the sub-cells 11 connected in series as in FIG. 5B.

Figure 3B:
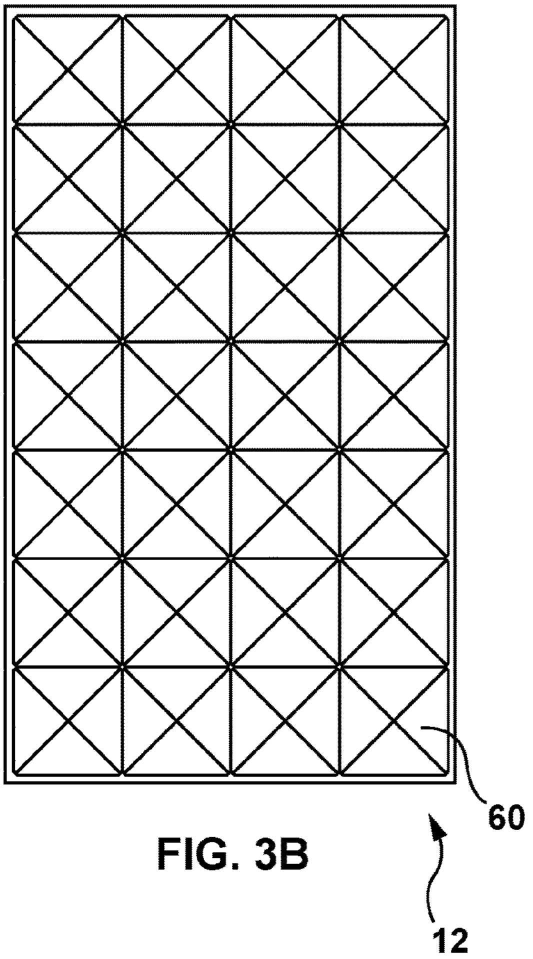
FIG. 3B is a top view of a plurality of triangular sub-cells arranged to form another example of a module.
Figure 4:
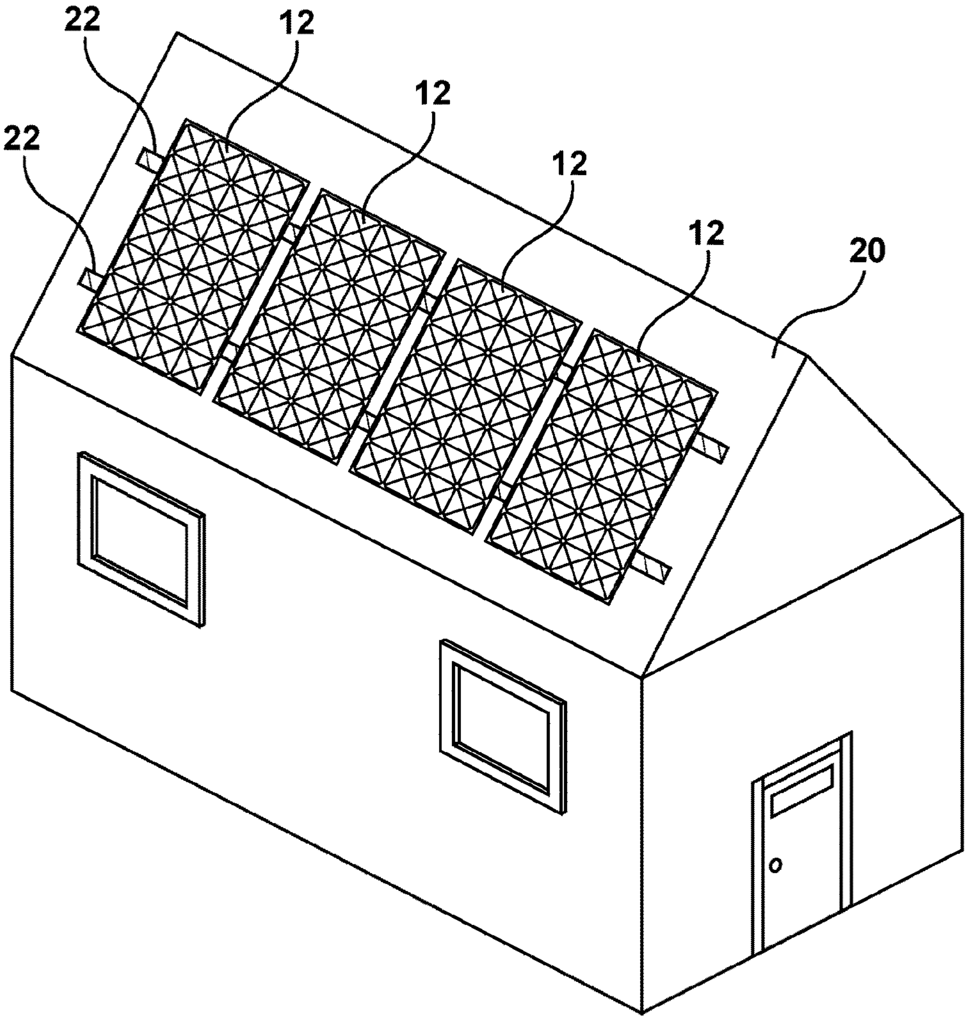
FIG. 4 is a perspective view of a plurality of the modules shown in FIG. 3B mounted on rails.

Referring to FIG. 3B, a plurality of substantially triangular photovoltaic sub-cells 60 are arranged to form a substantially rectangular module 12. The substantially triangular photovoltaic sub-cells 60 allow for unique form factors of the module 12 as illustrated. For example, the substantially triangular photovoltaic sub-cells 60 provide a differentiated dimension by which to arrange the sub-cells 60 with the diagonal dimension. Accordingly, the module 12 with a width similar to, but slightly narrower than the width of the module 10 can be achieved. It is to be appreciated by a person of skill with the benefit of this description that a smaller width increases the number of modules 12 that can fit on one or more rails 22 in an installation, such as on a rooftop 20 as shown in FIG. 4. For rooftop installations, where the length of the rails may be limited due to size constraints and where the number of roof penetrations is to be reduced, fitting an additional module 12 on the rails 22 increases the performance of the entire system. It is to be appreciated that the manner by which the substantially triangular photovoltaic sub-cells 60 are arranged may be varied to provide additional form factors.

Figure 3C:
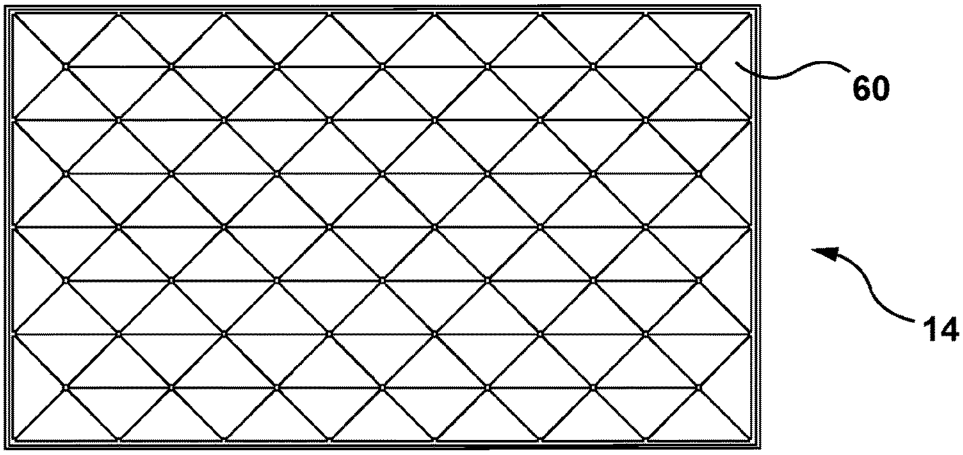
FIG. 3C is a top view of a plurality of triangular sub-cells arranged to form another example of a module.

Referring to FIG. 3C, a plurality of substantially triangular photovoltaic sub-cells 60 are arranged in a different manner to form another module 14. As shown, the module 14 is formed from the same number of triangular sub-cells as the module 14.

The module designs illustrate the layout of sub-cells of photovoltaic cells from the wafer 50. In the present example, the wafer 50 may be an industry standard about 182 mm by about 182 mm wafer size (sometimes referred to as M10) used for solar applications. Using the traditional rectangular half-cell approach form the module 10 shown in FIG. 3A provides a width that is about 5% to 10% larger than the module 12 or the module 14 formed from the diagonal cut half-cell as shown in FIGS. 3B and 3C, respectively. For example, the diagonal cut half-cell approach to form the module 12 may provide a module 12 width of about 1050 mm compared with a traditional rectangular half-cell approach that provides a module 10 width of about 1150 mm. It is to be appreciated that modules with a width of about 1050 mm have been widely accepted by the industry for residential rooftop photovoltaic installations. In addition to reducing the number of mounting rails and roof penetrations for a given photovoltaic system size, about 1050 mm is considered close to an upper threshold in terms of what can be handled using standard tools and installation practices.

Referring to FIG. 4, the module 12 may be mounted on one or more rails 22 behind each module 12 to allow for the connections to the first and last cell in the module 10 to the electrical circuit. Furthermore, the rails 22 may be mounted on to the rooftop 20 or any other suitable structure to collect light to generate power. It is to be appreciated by a person of skill with the benefit of this description that the rails 22 is not particularly limited and may be any rail 22 used to support a photovoltaic module and electronics to deliver the power generated by light. Furthermore, the rails 22 from a previous installation may be used to support the module 12, such as during an upgrade or replacements of an existing system.

Figure 5B:
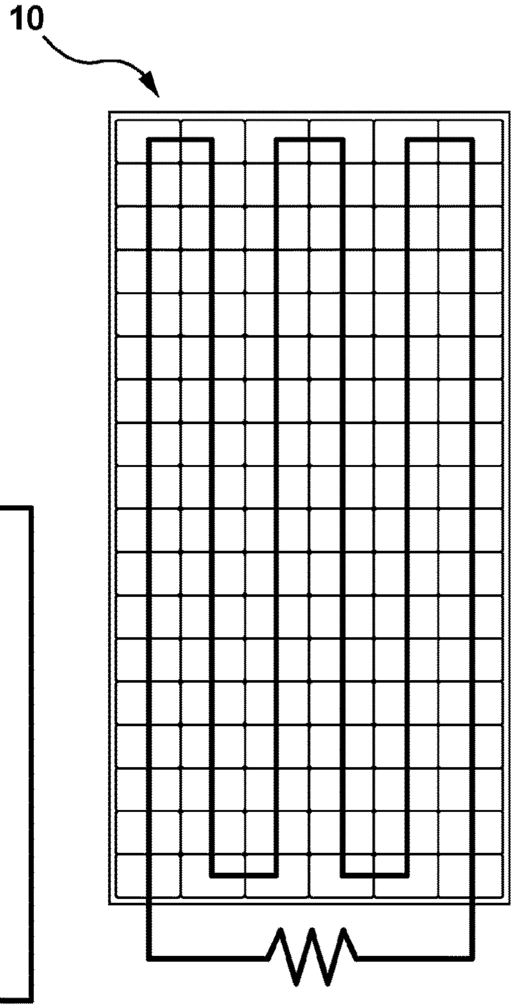
FIG. 5B is a top view of another example of the wiring of the sub-cells of the module shown in FIG. 3A.

The manner by which the current travels through the modules are not particularly limited. For example, FIGS. 5A and 5B illustrates how the current may travel through the module 10. It is to be appreciated that the pattern may be modified in other examples or separated into multiple circuits.

Figure 6A:
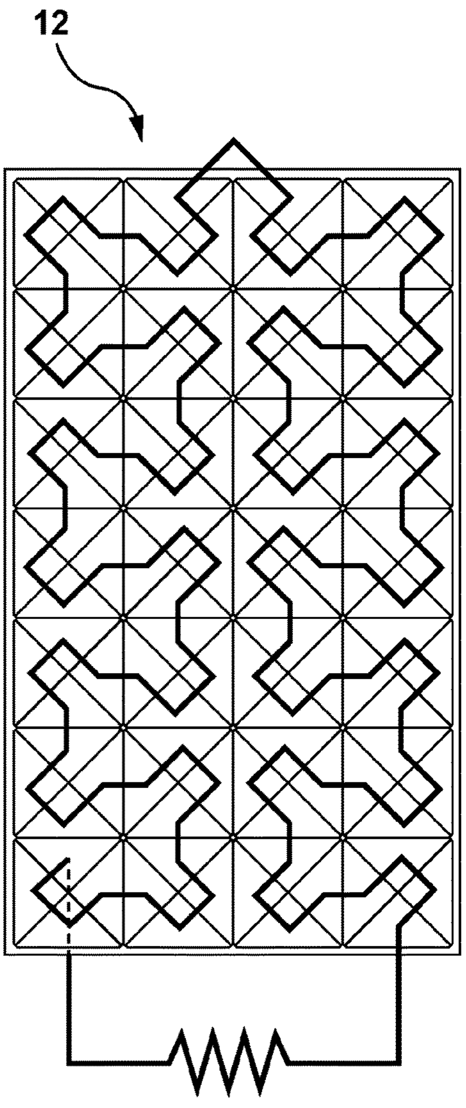
FIG. 6A is a top view of an example of the wiring of the sub-cells of the module shown in FIG. 3B.
Figure 6B:
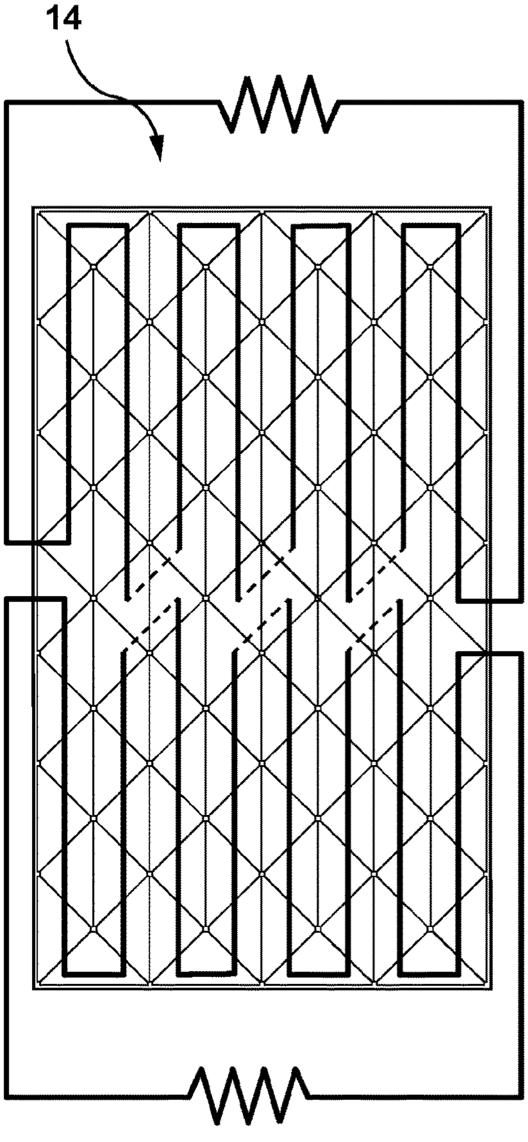
FIG. 6B is a top view of an example of the wiring of the sub-cells of the module shown in FIG. 3C.

Referring to FIGS. 6A and 6B, two manners by which a current flows through the modules 12 and 14, respectively, is illustrated. In the configuration shown in FIG. 6A, the module 12 provides a single circuit to collect current from the substantially triangular photovoltaic sub-cells 60. In the configuration shown in FIG. 6B, the module 14 provides a two parallel circuits to collect current from the substantially triangular photovoltaic sub-cells 60. The connections shown in FIG. 6B are made possible using the back-contact electro-conductive backsheet 54 to connect triangular sub-cells that may not be adjacent to each other (shown in the dashed connection lines). In this example, the electro-conductive backsheet 54 provides a connection that can snake through the module 14 to bypass contacts on some sub-cells 60. By selecting the sub-cells to connect, the module 14 may provide multiple circuits with matched current. In other examples, the ability to bypass sub-cells, electronic components associated with the module 14 (not shown) may also be disposed in a single location to reduce the amount of busing for the module 14 when electronics would need to be placed at multiple locations. In other examples, the modules 12 or 14 may be further divided into more circuits. It is to be appreciated by a person of skill with the benefit of this description that the interconnection of the sub-cells 60 in the present example can be configured in such a way to achieve a target current and voltage range of commercially available external power electronic units or protection devices such as bypass diodes. For traditional wire based interconnection methods, the use of additional external interconnection wires may provide a similar result, but may involve a more complicated infrastructure for the connections and may involve more cost prohibitive manufacturing processes.

Figure 7A:
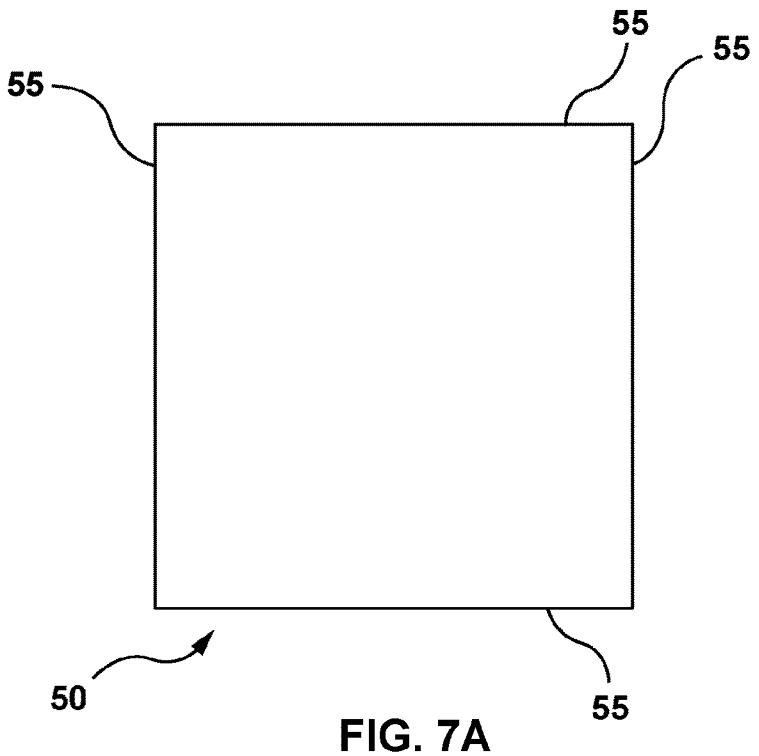
FIG. 7A is a top view of another example of a silicon wafer.
Figure 7B:
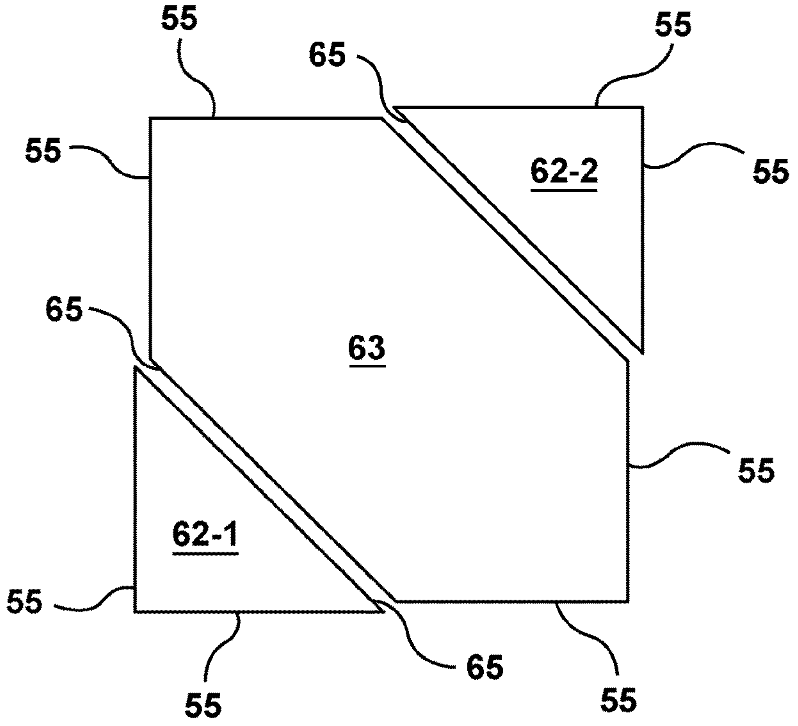
FIG. 7B is a top view of the silicon wafer of FIG. 7A cleaved along two parallel preferred cleavage planes.

Referring to FIGS. 7A and 7B, a substantially square crystalline silicon wafer 50 manufactured into a photovoltaic cell is generally shown as a whole (FIG. 7A) and cleaved along two {110} planes (FIG. 7B). In the present example, the wafer 50 is substantially similar to the wafer shown in FIG. 1A. The whole photovoltaic cell 50 can be cut into non-conventional shapes along preferred cleavage planes of the wafer 50, such as the {110} plane 65. Accordingly, cleaving along the {110} plane 65 will provide non-conventional substantially triangular sub-cells 62-1 and 62-2 (generically, these sub-cells are referred to herein as "sub-cell 62" and collective they are referred to as "sub-cells 62") and a central elongated hexagonal sub-cell 63. In the present example, the sub-cells 62 are each about one sixth of the area of the elongated hexagonal sub-cell 63. Accordingly, six of the substantially triangular sub-cells 62 can be connected in parallel to match the current of a single elongated hexagonal sub-cell 63.

Figure 8:
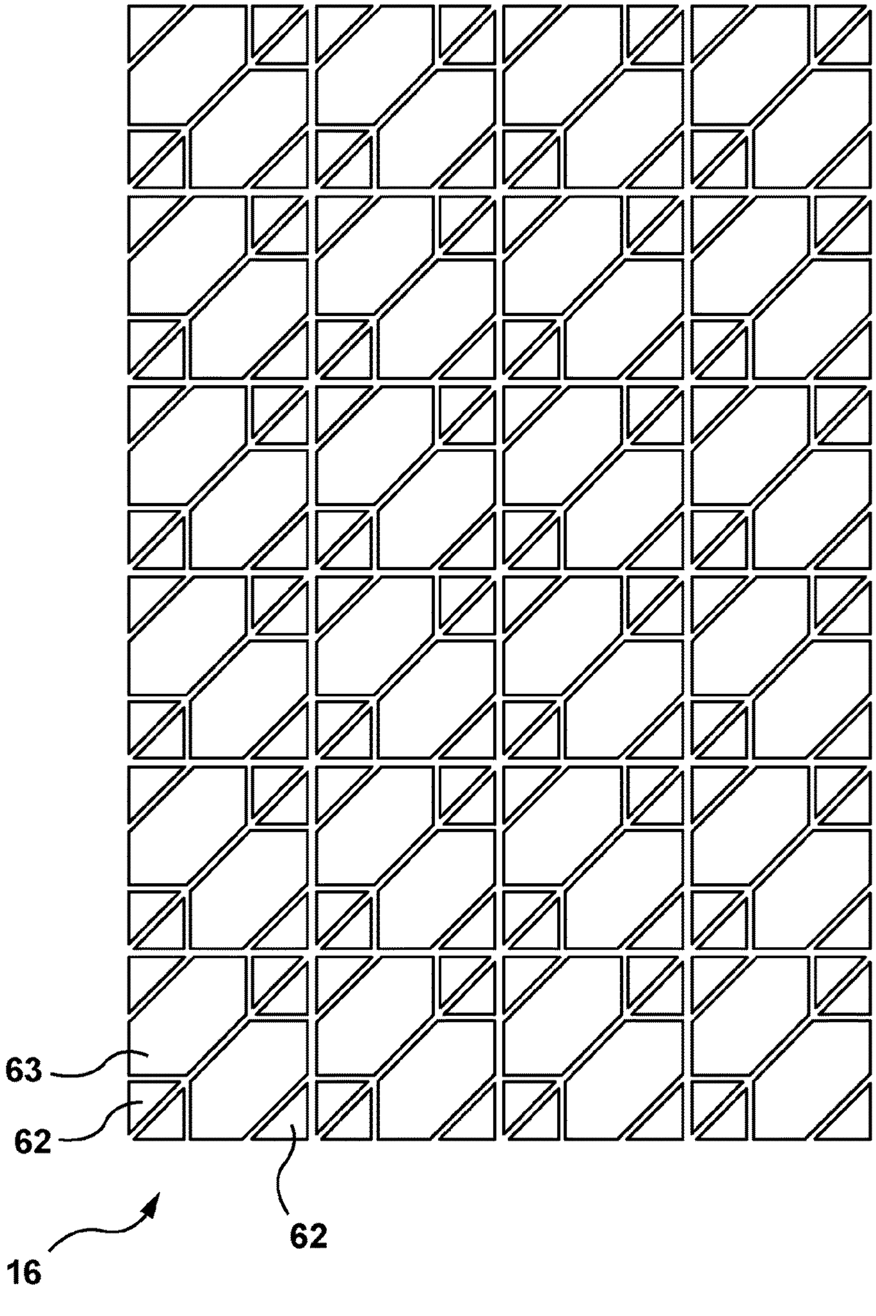
FIG. 8 is a top view of a plurality of sub-cells shown in FIG. 7B arranged to form an example of a module.

Referring to FIG. 8, a plurality of photovoltaic sub-cells 62 and photovoltaic sub-cells 63 are arranged to form a module 16. In this example, the tessellation includes an integer multiple of groups of six sub-cells 62. A combination of six sub-cells 62 connected in series with a sub-cell 63 generates about 75% the current of the original square cell. In the present example, the wafer 50 may be an industry standard 210 mm by 210 mm wafer size used for solar applications. The current produced from this size cell may exceed the operating range of commercially available power electronics units, such as micro-inverters. Accordingly, the module 16 producing 75% of that current would be more compatible with typical operating ranges.

Figure 9A:
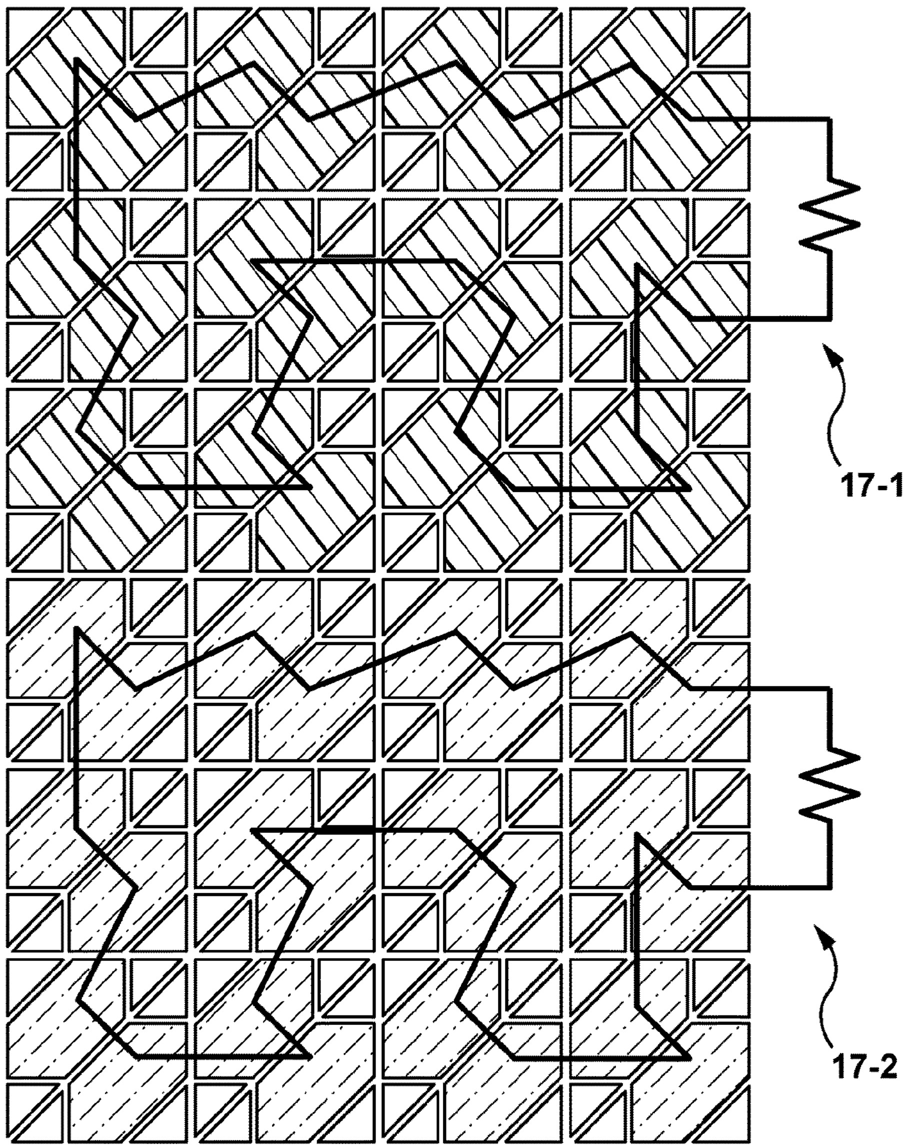
FIG. 9A is a top view of an example of the wiring of the hexagonal sub-cells of the module shown in FIG. 8.
Figure 9B:
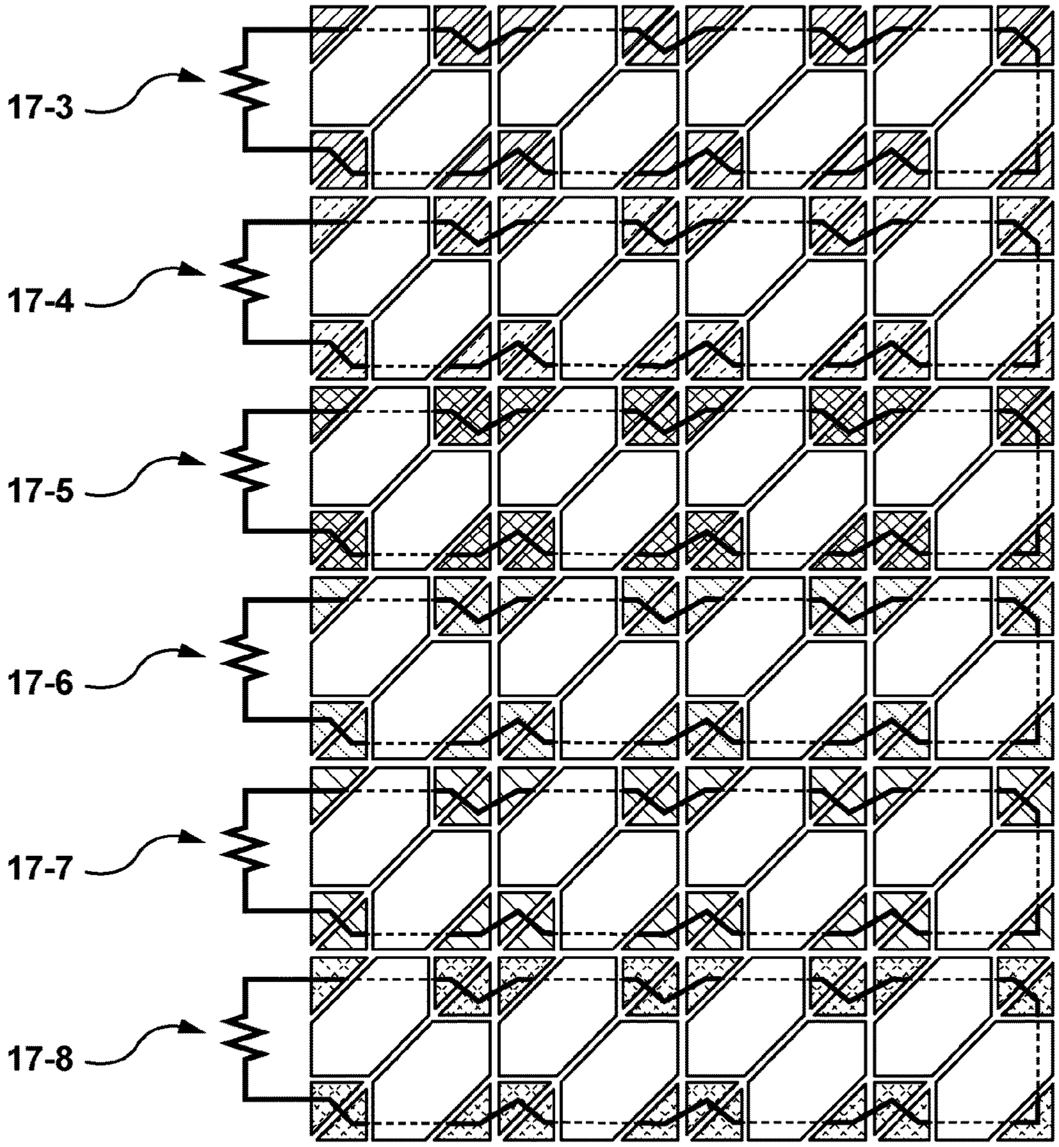
FIG. 9B is a top view of an example of the wiring of the triangular sub-cells of the module shown in FIG. 3C.
Figure 9C:
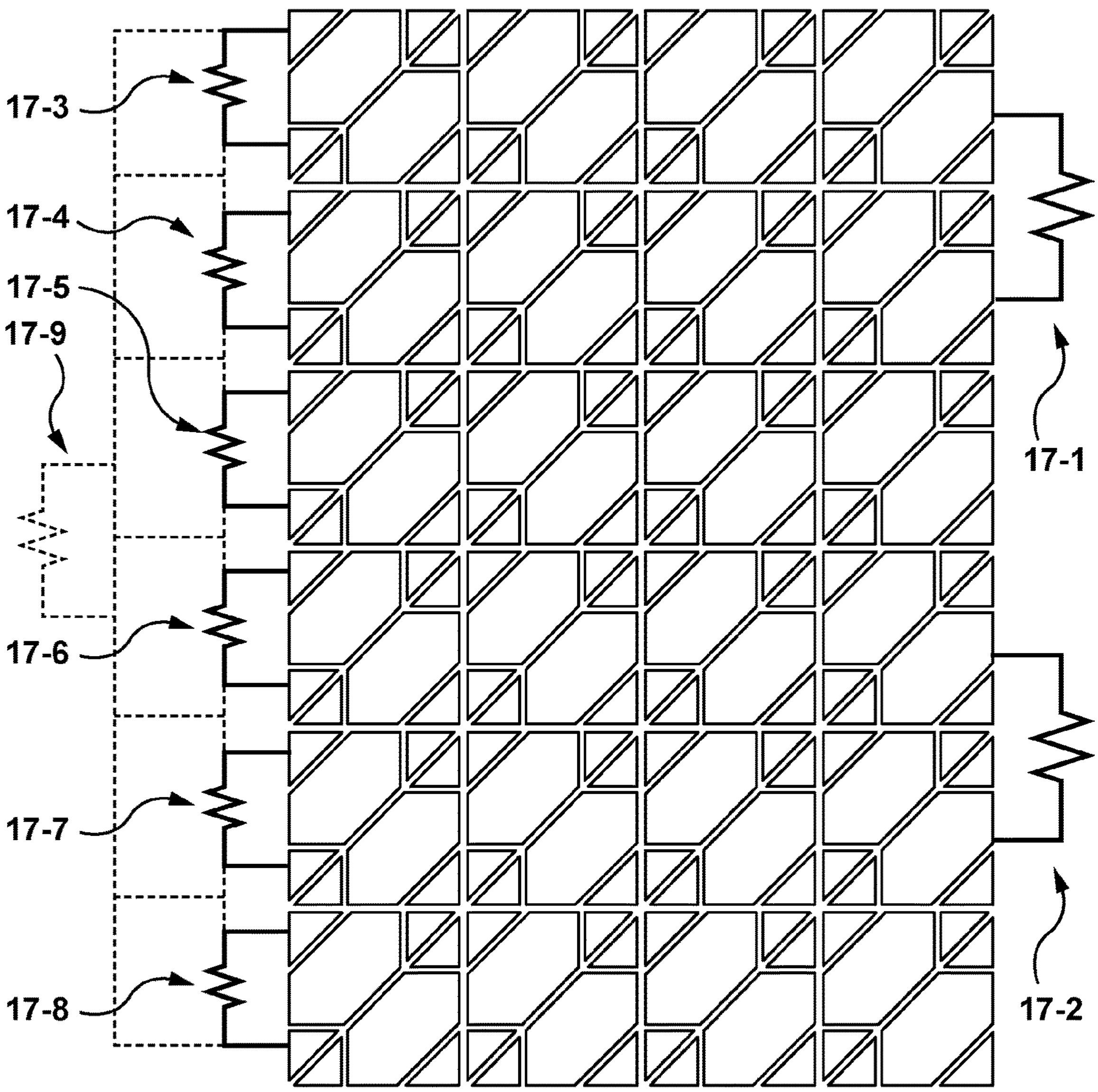
FIG. 9C is a top view of an example of the wiring of the module shown in FIG. 3C with three circuits with substantially equivalent power output.

Referring to FIG. 9A to 9C, examples of manners to connect sub cells 62 and sub-cells 63 in a module 16 is generally shown. In the FIG. 9A, the connection of the elongated hexagonal sub-cells 63 is shown to provide a first circuit 17-1 and a second circuit 17-2 to collect current from the elongated hexagonal sub-cells 63. In the configuration shown in FIG. 9A, the first circuit 17-1 and the second circuit 17-2 produce substantially the same amount of current provided that the light exposure across the module 16 is substantially uniform. Referring to FIG. 9B, the connection of the substantially triangular sub-cell 62 is shown to provide a circuits 17-3, 17-4, 17-5, 17-6, 17-7, and 17-8 to collect current from the substantially triangular sub-cells 62. In the present example, the sum of the current collected by each of circuits 17-3, 17-4, 17-5, 17-6, 17-7, and 17-8 is substantially the same as each other. The sum of the current collected from the circuits 17-3, 17-4, 17-5, 17-6, 17-7, and 17-8 may be substantially the same as each of the first circuit 17-1 and the second circuit 17-2. It is to be appreciated by a person of skill with the art that the sub-cells 62 and the sub-cells 63 may be connected at the same time as shown in FIG. 9C. In this example, the circuits 17-3, 17-4, 17-5, 17-6, 17-7, and 17-8 may also be connected to form a circuit 17-9 to provide substantially the same current as each of the first circuit 17-1 and the second circuit 17-2. By substantially matching the currents, the module 16 may be able to provide the uniform power to an application.

Figure 10:
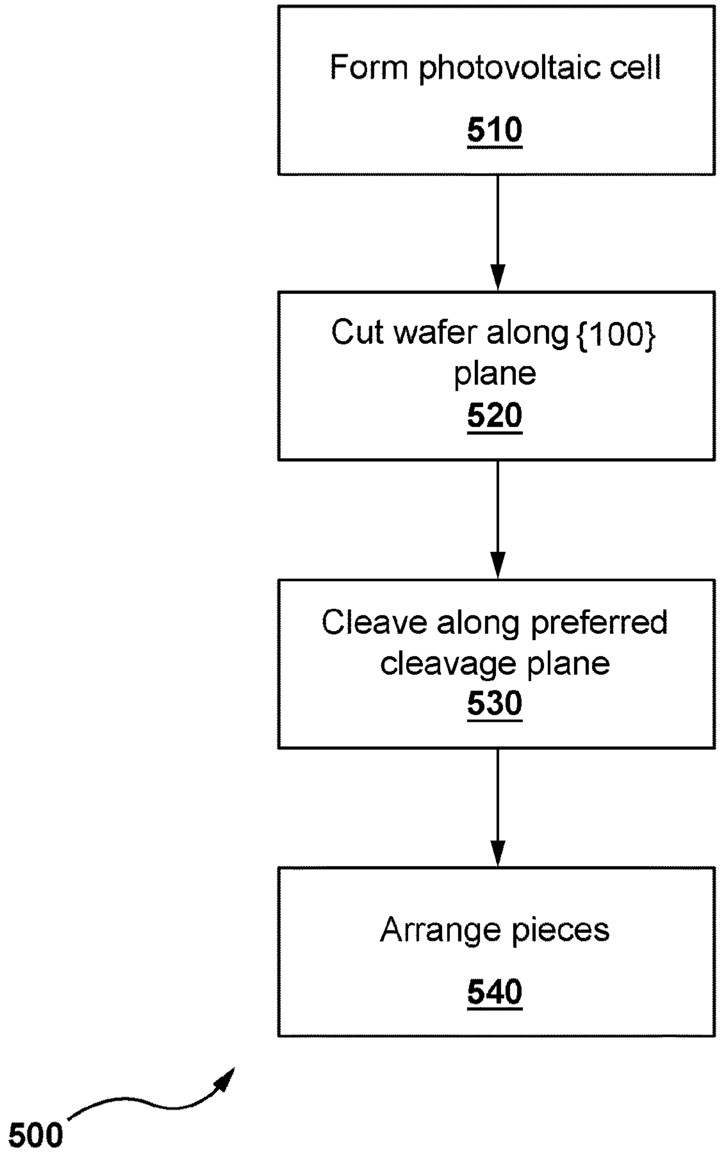
FIG. 10 is a flowchart of an example method of creating standardized data and a processing command.

Referring to FIG. 10, a flowchart of an example method of assembling a photovoltaic module is generally shown at 500. In order to assist in the explanation of method 500, it will be assumed that method 500 may be performed to assemble the module 12. Indeed, the method 500 may be one way in which the module 12 may be assembled. Furthermore, the following discussion of method 500 may lead to a further understanding of the module 12 and its components. In addition, it is to be emphasized, that method 500 may not be performed in the exact sequence as shown, and various blocks may be performed in parallel rather than in sequence, or in a different sequence altogether.

Beginning at block 510, a photovoltaic cell on a silicon wafer 50 is formed. The manner by which the photovoltaic cell is formed on the silicon wafer 50 is not particularly limited and may include various processing steps (e.g. surface texturing, silicon doping, thin film deposition, etc.). The silicon wafer 50 is also cut into substantially square pieces along the {100} planes of the wafer 50 at block 520. It is to be appreciated by a person of skill with the benefit of this description that the cutting of the silicon wafer 50 is not limited and may be mechanically cut with a diamond saw or other suitable blade. Furthermore, it is to be understood that the wafer 50 may be cut into substantially square pieces either before or after the processing of block 510.

Block 530 involves cleaving the substantially square wafer pieces into substantially triangular sub-cells 60 to provide a shape that can be used to tessellate with other sub-cells 60 to form the module 12 at block 540. In the present example, the photovoltaic sub-cells 60 have contacts on the back and a flexible electro-conductive backsheet 54 with the circuit connections monolithically integrated is used to connect the sub-cells 60.

Various further advantages of using triangular sub-cells will become apparent to a person of skill. For example, by cutting the wafer 50 along the diagonal into triangular sub-cells, the modules 12 and 14 provide a larger perimeter to area ratio than when rectangular sub-cells are used, such as in the module 10. This increased perimeter to area ratio allows areas surrounding the edges of the triangular sub-cells to provide additional reflected light to increase the overall light capture within the active area of each triangular sub-cell. For the same active area of a module, the edge reflections provide an increase to the power.

It is to be recognized that features and aspects of the various examples provided above may be combined into further examples that also fall within the scope of the present disclosure.

What is claimed is:

1. A method comprising:

forming a photovoltaic cell on a silicon wafer;

cutting the silicon wafer along a {100} plane to provide a substantially square wafer;

cleaving the substantially square wafer along a preferred cleavage plane into separate pieces to form substantially triangular photovoltaic cells to tessellate with additional substantially triangular photovoltaic cells to form a module; and arranging a plurality of substantially triangular photovoltaic cells to form the module.

2. The method of claim 1, wherein cleaving along the preferred cleavage plane comprises cleaving along a {110} plane.

3. The method of claim 1, further comprising connecting the plurality of substantially triangular photovoltaic cells with an electro-conductive backsheet.

* * * * *